(12) United States Patent
Gouzu et al.

(10) Patent No.: US 8,980,424 B2
(45) Date of Patent: Mar. 17, 2015

(54) PREPREG, METAL-CLAD LAMINATE, AND PRINTED CIRCUIT BOARD

(75) Inventors: Shuuji Gouzu, Ibaraki (JP); Makoto Yanagida, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 134 days.

(21) Appl. No.: 13/700,587

(22) PCT Filed: May 31, 2011

(86) PCT No.: PCT/JP2011/062517
§ 371 (c)(1),
(2), (4) Date: Jan. 10, 2013

(87) PCT Pub. No.: WO2011/152413
PCT Pub. Date: Dec. 8, 2011

(65) Prior Publication Data
US 2013/0126218 A1    May 23, 2013

(30) Foreign Application Priority Data

| May 31, 2010 | (JP) | 2010-124325 |
| May 31, 2010 | (JP) | 2010-124326 |
| May 31, 2010 | (JP) | 2010-124327 |
| May 31, 2010 | (JP) | 2010-124328 |

(51) Int. Cl.
| B32B 5/16 | (2006.01) |
| B32B 18/00 | (2006.01) |
| H05K 1/03 | (2006.01) |
| B32B 15/08 | (2006.01) |
| B32B 27/38 | (2006.01) |
| C08G 59/08 | (2006.01) |
| C08G 59/40 | (2006.01) |
| C08J 5/24 | (2006.01) |
| B32B 3/10 | (2006.01) |
| B32B 15/092 | (2006.01) |
| C08L 63/00 | (2006.01) |
| H05K 3/02 | (2006.01) |

(52) U.S. Cl.
CPC ............ *H05K 1/0306* (2013.01); *B32B 15/08* (2013.01); *B32B 27/38* (2013.01); *C08G 59/08* (2013.01); *C08G 59/4071* (2013.01); *C08J 5/24* (2013.01); *H05K 1/0326* (2013.01); *B32B 3/10* (2013.01); *B32B 15/092* (2013.01); *C08L 63/00* (2013.01); *C08J 2363/00* (2013.01); *H05K 1/0366* (2013.01); *H05K 3/022* (2013.01)
USPC ............................ 428/323; 428/325; 428/329

(58) Field of Classification Search
None
See application file for complete search history.

(56) References Cited

U.S. PATENT DOCUMENTS

| 7,758,951 B2 * | 7/2010 | Takeuchi et al. ........... 428/292.1 |
| 7,871,694 B2 * | 1/2011 | Takeuchi et al. ........... 428/292.1 |
| 2008/0206451 A1 | 8/2008 | Kwak et al. |
| 2010/0261837 A1 * | 10/2010 | Gan .............................. 524/590 |
| 2011/0054077 A1 | 3/2011 | Gan |

FOREIGN PATENT DOCUMENTS

| JP | 7-206983 | 8/1995 |
| JP | 2001-261933 | 9/2001 |
| JP | 2003-201332 | 7/2003 |
| JP | 2004-182850 | 7/2004 |
| JP | 2004-269727 | 9/2004 |
| JP | 2007-535600 | 12/2007 |
| JP | 2009-74036 | 4/2009 |
| JP | 2009-155398 | 7/2009 |
| JP | 2010-31263 | 2/2010 |
| WO | WO 2008/140059 A1 | 11/2008 |
| WO | WO 2009/070488 A1 | 6/2009 |
| WO | WO 2010/106698 A1 | 9/2010 |

OTHER PUBLICATIONS

Extended European Search Report dated Dec. 19, 2013, including the Supplementary European Search Report and the European Search Opinion, for EU Application No. 11789816.3-1301/2578632 (PCT/JP2011/062517).
Chinese Official Action dated Aug. 29, 2014, for CN Application No. 201180026869.8.

* cited by examiner

*Primary Examiner* — Sheeba Ahmed
(74) *Attorney, Agent, or Firm* — Antonelli, Terry, Stout & Kraus, LLP.

(57) ABSTRACT

Provided is a prepreg prepared by impregnating a base material with a resin composition, wherein the resin composition contains aluminum hydroxide having an average particle diameter of 2.5 to 4.5 μm and a glass filler having an average particle diameter of 1.0 to 3.0 μm, a specific gravity of 2.3 to 2.6 g/cm$^3$ and a SiO$_2$ content of 50 to 65% by mass; and a sum of blending amounts of aluminum hydroxide and the glass filler is 30 to 50% by mass based on a whole amount of solid matters in the resin composition. According to the above prepreg, capable of being obtained is a metal clad laminated plate in which in spite of using an inorganic filler such as silica and the like and aluminum hydroxide in combination, the inorganic filler is evenly dispersed and which is excellent in a processability and has a low thermal expansion coefficient.

7 Claims, No Drawings

PREPREG, METAL-CLAD LAMINATE, AND PRINTED CIRCUIT BOARD

TECHNICAL FIELD

The present invention relates to a prepreg, a metal clad laminated plate and a printed wiring board prepared by using the above prepreg.

BACKGROUND OF THE INVENTION

In recent years, a trend in which mounting is transferred from conventional surface mounting to area mounting due to progress of high density mounting technologies proceeds in the fields of electronic devices such as semiconductors and the like, and new packages such as BGA (ball grid ally), CSP (chip size package) and the like appear and are increasing. Accordingly, boards for interposers come to attract attentions more than before, and requirements to glass epoxy boards having a high heat resistance and a low thermal expansion are increased.

Under such circumstances, inorganic fillers, particularly spherical molten silicas are usually used in many cases in order to reduce usually a thermal expansion coefficient. Further, as environmental problems grow high, resins containing no halides are required and used as a flame retardant in combination with inorganic hydroxides including aluminum hydroxide in many cases (for example, patent documents 1 to 3).

PATENT DOCUMENTS

Patent document 1: Japanese Patent Application Laid-Open No. 31263/2010
Patent document 2: Japanese Patent Application Laid-Open No. 74036/2009
Patent document 3: Japanese Patent Application Laid-Open No. 155398/2009

DISCLOSURE OF THE INVENTION

Problems that the Invention is to Solve

In prepregs prepared by blending a glass filler such as silica and the like for the purpose of reducing a thermal expansion coefficient and using aluminum hydroxide in combination for the purpose of ensuring a flame retardance and enhancing a processability, when preparing a base material by using the above prepregs, stripes formed by the flowing resin are produced at an end part of the base material due to an ununiformity of a fluidity between the glass filler and aluminum hydroxide to bring about the problems that the base material is deteriorated in an appearance and reduced in characteristics at an end part as compared with a central part and that the base material is reduced in a drilling processability.

Accordingly, an object of the present invention is to provide a prepreg in which in spite of using aluminum hydroxide in combination with a glass filler such as silica and the like for the purpose of ensuring a flame retardance and enhancing a processability, the glass filler is evenly dispersed to ensure a fluidity of the resin and which makes it possible to obtain a metal clad laminated plate having an excellent circuit formability and an excellent drilling processability and provided with low thermal expansion, a metal clad laminated plate prepared by using the above prepreg and a printed wiring board.

Means for Solving the Problems

The present invention shall provide inventions shown in the following items [1] to [7].

[1] A prepreg prepared by impregnating a base material with a resin composition, wherein the resin composition contains aluminum hydroxide having an average particle diameter of 2.5 to 4.5 μm and a glass filler having an average particle diameter of 1.0 to 3.0 μm, a specific gravity of 2.3 to 2.6 g/cm$^3$ and a SiO$_2$ content of 50 to 65% by mass; and a sum of blending amounts of aluminum hydroxide and the glass filler is 30 to 50% by mass based on a whole amount of solid matters in the resin composition.

[2] The prepreg according to the item [1] described above, wherein the resin composition contains a non-halogenated epoxy compound having at least two or more epoxy groups in a molecule.

[3] The prepreg according to the item [1] or [2] described above, wherein the resin composition contains a phosphorus-containing curing agent represented by the following Chemical Formula (1):

[Ka 1]

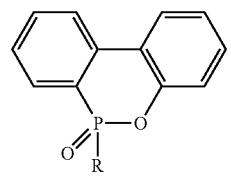

(1)

(wherein R is an organic group having two or more phenolic hydroxyl groups and a molecular weight of 180 or more).

[4] The prepreg according to the item [3] described above, wherein the organic group represented by R in Chemical Formula (1) comprises at least one structure selected from structures represented by the following Chemical Formulas (2), (3), (4), (5) and (6) and has two or more phenolic hydroxyl groups:
(* in Formulas (2) to (6) shows a part bonded directly to a phosphorus atom in Chemical Formula (1)):

[Ka 2]

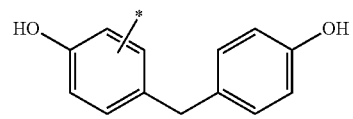

(2)

[Ka 3]

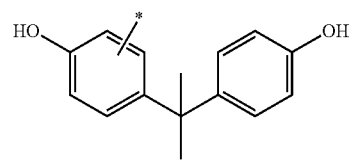

(3)

[Ka 4]

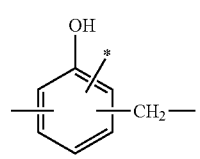

(4)

[Ka 5]

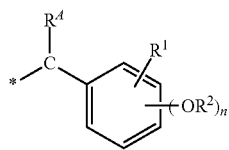
(5)

($R^1$ in Formula (5) is a hydrogen atom or an alkyl group having 1 to 3 carbon atoms, and $R^2$ is an alkyl group having 1 to 4 carbon atoms; n is a number of a $OR^2$ group in the aromatic ring and is any of 1 to 3; and $R^A$ is an organic group having two or more phenolic hydroxyl groups);

[Ka 6]

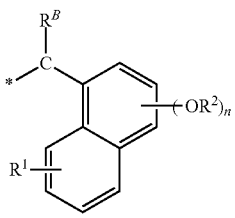
(6)

($R^1$ in Formula (6) is a hydrogen atom or an alkyl group having 1 to 3 carbon atoms, and $R^2$ is an alkyl group having 1 to 4 carbon atoms; n is a number of a $OR^2$ group in the aromatic ring and is any of 1 to 3; and $R^B$ is an organic group having two or more phenolic hydroxyl groups).

[5] The prepreg according to the item [4] described above, wherein the organic group represented by R in Chemical Formula (1) comprises at least one structure selected from structures represented by the following Chemical Formulas (7), (8) and (9) and has two or more phenolic hydroxyl groups:

(* in Chemical Formulas (7) to (9) shows a part bonded directly to a phosphorus atom in Chemical Formula (1):

[Ka 7]

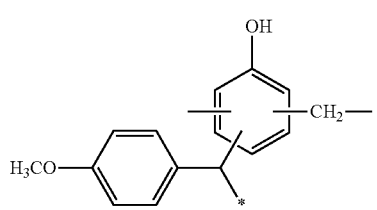
(7)

[Ka 8]

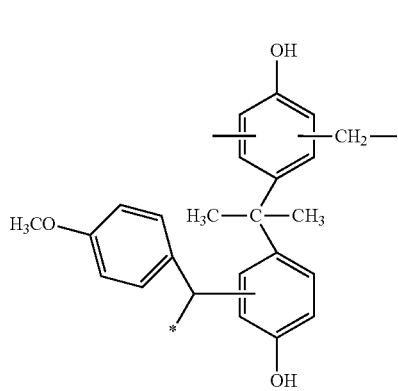
(8)

[Ka 9]

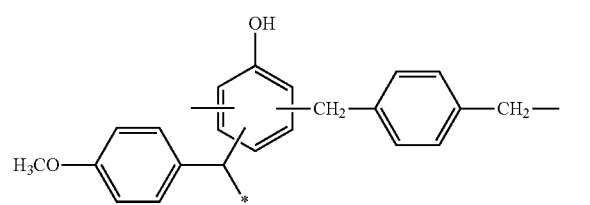
(9)

[6] A metal clad laminated plate prepared by superposing one or plural plates of the prepreg according to any of the items [1] to [5], providing a metal foil on both faces or one face thereof and heating and pressurizing it.

[7] A printed wiring board prepared by subjecting a metal layer of the metal clad laminated plate according to the item [6] to wiring processing.

Advantage of the Invention

According to the present invention, capable of being provided are a prepreg in which in spite of using a glass filler and aluminum hydroxide in combination, the glass filler is evenly dispersed and which makes it possible to obtain a metal clad laminated plate having an excellent drilling processability and a low thermal expansion coefficient, a metal clad laminated plate prepared by using the above prepreg and a printed wiring board.

MODE FOR CARRYING OUT THE INVENTION

Prepreg:
A prepreg used in the present invention is prepared by impregnating a base material with a specific resin composition.

<Base Material>
The base material shall not specifically be restricted as long as it is used in producing metal foil clad laminated plates and multilayer printed wiring boards, and fibrous base materials such as woven fabrics, non-woven fabrics and the like are usually used. The material of the fibrous base materials includes inorganic fibers such as glass, alumina, boron, silica alumina glass, silica glass, tyranno, silicon carbide, silicon nitride, zirconia and the like, organic fibers such as aramid, polyether ether ketone, polyetherimide, polyethersulfone, carbon, cellulose and the like and mixtures thereof. In particular, woven fabrics of glass fibers are preferably used. Glass woven fabrics of 10 to 200 μm are particularly suitably used as the base material used for the prepreg.

<Resin Composition>
The resin composition described above contains aluminum hydroxide having an average particle diameter of 2.5 to 4.5 μm and a glass filler having an average particle diameter of 1.0 to 3.0 μm, a specific gravity of 2.3 to 2.6 g/cm³ and a $SiO_2$ percentage of 50 to 65% by mass, and a sum of blending amounts of aluminum hydroxide and the glass filler is 30 to 50% by mass based on a whole amount of solid matters in the resin composition.

Next, the respective components of the resin composition shall be explained.

<<Aluminum Hydroxide>>
The resin composition described above contains aluminum hydroxide. Aluminum hydroxide has a large number of hydrated water as compared with magnesium hydroxide and other inorganic hydrates, and it has a good flame retardance and is relatively stable against alkalis, so that it is suited to applications of laminated plates. Also, taking a fluidity of the resin into consideration, an average particle diameter of aluminum hydroxide has to be 2.5 to 4.5 μm. If it is lower than 2.5 μm, a chemical resistance thereof is reduced due to an increase in a specific surface area thereof. On the other hand, if it is higher than 4.5 μm, aluminum hydroxide settles down faster in the varnish. Accordingly, both are not preferred.

The average particle diameter can be measured by means of, for example, a laser dispersion particle size distribution meter MT3000 manufactured by Nikkiso Co., Ltd., wherein water is used as a dispersion liquid.

<<Glass filler>>

A filler having a $SiO_2$ content of 50 to 65% by mass is used as the glass filler. If the $SiO_2$ content is less than 50% by mass, the thermal expansion reduction effect is reduced, and if it is larger than 65% by mass, the processability such as drilling and the like is deteriorated. Accordingly, both are not preferred.

Components other than $SiO_2$ in the glass filler include $Al_2O_3$, $K_2O$, $Na_2O$, $CaO$, $Fe_2O_3$, $B_2O_3$, $SrO$, $MgO$, $MnO$, $GeO_2$, $P_2O_3$, $P_2O_5$, $Y_2O_5$, $ZrO_2$ and the like, and they shall not be restricted thereto.

Also, the glass filler has an average particle diameter of 1.0 to 3.0 μm and a specific gravity of 2.3 to 2.6 g/cm$^3$. The prepreg containing a glass filler falling outside the above ranges is reduced in a fluidity of the resin to a large extent and brings about coagulation, and it is inferior in a circuit formability.

In respect to the thermal expansion characteristics, the thermal expansion coefficient in Tg or lower is preferably 40 ppm/° C. Also, if a melting temperature of the glass filler is 1700° C. or higher, stirring is evenly carried out, and the quality is stabilized, so that it is preferred.

<<Aluminum Hydroxide and Glass Filler>>

A sum of blending amounts of aluminum hydroxide and the glass filler is 30 to 50% by mass based on a whole amount of solid matters in the resin composition. If the above sum is lower than 30% by mass, low thermal expansion characteristic for ensuring the connection reliability is not obtained, and if is higher than 50% by mass, a reduction in the outer layer peeling strength, an increase in the drilling abrasion amount and a reduction in the circuit formability are observed.

A use ratio of aluminum hydroxide and the glass filler can optionally be set, and it is preferably 4:6 to 6:4. If it falls in the above range, the copper clad laminated plate has a high flame resistance and a small drilling abrasion amount, and the resin composition is excellent in a fluidity.

<<Resin>>

The resin contained in the resin composition shall not specifically be restricted, and it is preferably a thermosetting resin and may be a thermoplastic resin having a high heat resistance. Used as the resin are, for example, epoxy resins, polyimide resins, triazine resins, melamine resins, phenol resins and the like. Also, these resins may be used in combination of two or more kinds thereof and may be blended, if necessary, with various kinds of curing agents and curing accelerating agents each described later, and they may be blended as a solvent and a solution.

Epoxy resins having at least two or more epoxy groups in a molecule are preferably used as the epoxy resin described above. In particular, a non-halogenated epoxy compound having at least two or more epoxy groups in a molecule and containing no halogen atoms is preferably contained therein. This prevents poisonous gases originating in halogen elements from being generated in combustion brought about by a fire and the like and prevents as well the heat resistance and the reliability from being reduced by decomposition of halogen elements in heating. The above non-halogenated epoxy compound includes, for example, bisphenol A epoxy resins, bisphenol F epoxy resins, bisphenol S type epoxy resins, biphenyl type epoxy resins, alicyclic epoxy resins, phenol novolac epoxy resins, bisphenol A novolac epoxy resins, cresol novolac epoxy resins, diglycidyl ether compounds of multifunctional phenols, diglycidyl ether compounds of polyhydric alcohols, hydrogenated products thereof and the like, but it shall not be restricted to the above compounds. The above non-halogenated epoxy compounds may be used alone or in combination of several kinds thereof. Among them, novolac type epoxy resins such as phenol novolac epoxy resins, bisphenol A novolac epoxy resins, cresol novolac epoxy resins and the like are preferred considering a heat resistance and a high glass transition temperature. Also, considering electric characteristics, epoxy resins such as tetramethylbiphenyl type epoxy resins, phenol aralkyl epoxy resins, naphthalene aralkyl epoxy resins, cyclopentadiene type epoxy resins and the like are preferably used.

<<Curing Agent>>

Various compounds which have so far been publicly known can be used as the curing agent, and when epoxy resins are used as the resin, capable of being listed are amine compounds such as dicyandiamide, diaminodiphenylmethane, diaminodiphenylsulfone and the like, acid anhydride compounds such as phthalic anhydride, pyromellitic anhydride and the like and multifunctional phenol compounds such as phenol novolac resins, cresol novolac resins and the like. The above curing agents can be used as well in combination of several kinds thereof.

Phosphorus-Containing Curing Agent:

Further, a phosphorus-containing curing agent can be used as well. A phosphorus-containing curing agent represented by the following Chemical Formula (1) can suitably be used as the above phosphorus-containing curing agent:

[Ka 10]

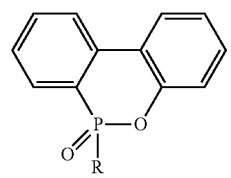

(1)

(wherein R is an organic group having two or more phenolic hydroxyl groups and a molecular weight of 180 or more).

Molded articles such as prepregs and metal clad laminated plates which are prepared by using the above phosphorus-containing curing agent have a flame retardance, and characteristics thereof such as a heat resistance, electric characteristics, a water resistance and the like are very good as well.

In Chemical Formula (1) described above, R is preferably an organic group having two or more phenolic hydroxyl groups and a molecular weight of 180 or more, more preferably an organic group having a molecular weight of 190 or more. If the molecular weight is 180 or more, the phosphorus curing agent is enhanced in a solvent solubility and improved in a handling property. The phosphorus-containing curing agent includes, for example, HCA-HQ (10-(2,5-dihydroxyphenyl)-10H-9-oxa-10-phosphaphenanthrene-10-oxide), HCA-NQ (10-(2,7-dihydroxynaphthyl)-10-dihydro-9-oxa-10-phosphaphenanthrene-10-oxide) and the like.

The above compounds have a low solubility in solvents, and therefore they are blended usually after carrying out pre-reaction. Further, the organic group (R) has preferably a structure represented by a chemical formula (—(CH$_2$)—) in a structure thereof. When the organic group has the structure represented by the chemical formula (—(CH$_2$)—), the heat resistance is enhanced, and the handling property is improved.

From the viewpoint of the flame retardance, a phosphorus content in the resin composition is preferably 0.8 to 5.0% by mass, more preferably 1.0 to 2.5% by mass based on a whole solid matter of the resin composition. When the phosphorus content is less than 0.8% by mass based on a whole solid matter of the resin composition, the stable flame retardance is less liable to be obtained, and when it exceeds 5.0% by mass, the characteristics of the cured matter are deteriorated.

In this connection, the phosphorus content is a content of phosphorus atoms in the resin composition, and for example, in a case in which one phosphorus atom is present in a substance having a molecular weight of 620 and in which 50% by mass of the above substance is contained in the composition, a phosphorus component content thereof is 2.5% by mass (an atomic weight of a phosphorus atom is about 31, and therefore 31/620×0.5=0.025).

Organic Group Represented by R in Chemical Formula (1):

The organic group represented by R in Chemical Formula (1) comprises at least one structure selected from structures represented by the following Chemical Formulas (2), (3), (4), (5) and (6) and has two or more phenolic hydroxyl groups. A mark * in Chemical Formulas (2) to (6) shows a part bonded directly to a phosphorus atom in Chemical Formula (1):

[Ka 11]

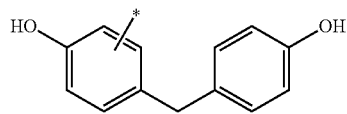

(2)

[Ka 12]

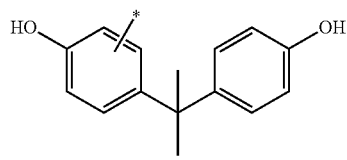

(3)

[Ka 13]

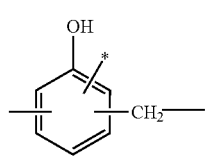

(4)

[Ka 14]

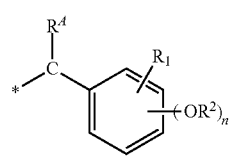

(5)

($R^1$ in Chemical Formula (5) is a hydrogen atom or an alkyl group having 1 to 3 carbon atoms, and $R^2$ is an alkyl group having 1 to 4 carbon atoms; n is a number of a $OR^2$ group in the aromatic ring and is any of 1 to 3; and $R^A$ is an organic group having two or more phenolic hydroxyl groups);

[Ka 15]

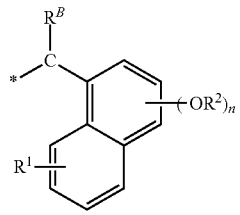

(6)

($R^1$ in Formula (6) is a hydrogen atom or an alkyl group having 1 to 3 carbon atoms, and $R^2$ is an alkyl group having 1 to 4 carbon atoms; n is a number of a $OR^2$ group in the aromatic ring and is any of 1 to 3; and $R^B$ is an organic group having two or more phenolic hydroxyl groups).

Also, the organic group represented by R in Chemical Formula (1) can be an organic group comprising at least one structure selected from structures represented by the following Chemical Formulas (7), (8) and (9) and having two or more phenolic hydroxyl groups. A mark * in Formulas (7) to (9) shows a part bonded directly to a phosphorus atom in Chemical Formula (1):

[Ka 16]

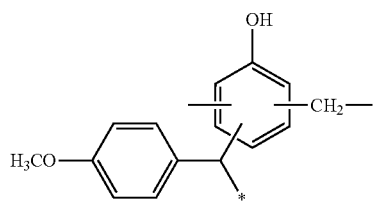

(7)

[Ka 17]

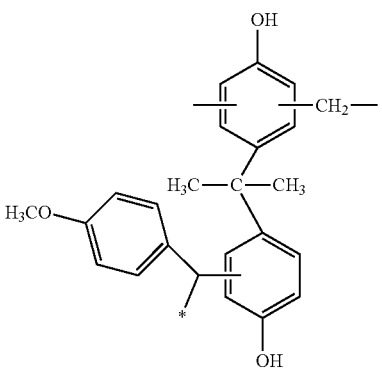

(8)

[Ka 18]

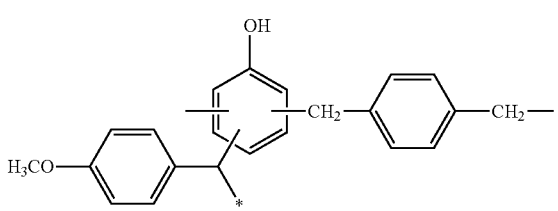

(9)

When provided with the structure represented by Chemical Formula (2) described above, the resin composition containing the above phosphorus-containing curing agent is enhanced in a heat resistance. Also, the phosphorus-containing curing agent is improved in a solubility in a solvent which is the reaction system and therefore enhanced in a handling property.

When provided with the structure represented by Chemical Formula (3) described above, the resin composition containing the above phosphorus-containing curing agent is improved in a reactivity with the resin.

When provided with the structure represented by Chemical Formula (4) described above, the resin composition containing the above phosphorus-containing curing agent is improved in a heat resistance.

When provided with the structures represented by Chemical Formulas (5) to (9) described above, the resin compositions containing the above phosphorus-containing curing agents are improved in a heat resistance.

In particular, the phosphorus-containing curing agent having the structure represented by Chemical Formula (2) described above has a low viscosity, and therefore it is excellent in a handling property and can be enhanced in a productivity.

Phosphorus-Containing Curing Agent 1:

The phosphorus-containing curing agent can be, for example, a resin having a structural unit A represented by the following Chemical Formula (10) and a structural unit B represented by the following Chemical Formula (11):

[Ka 19]

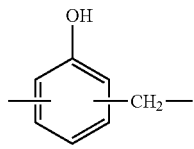

(10)

[Ka 20]

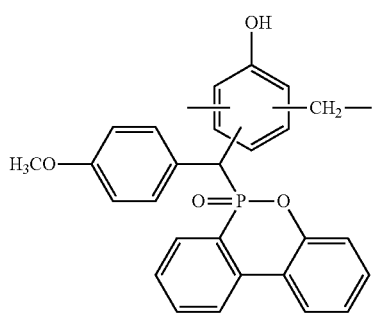

(11)

That is, the above resin may have a unit in which plural structural units A are continuously connected, a unit in which plural structural units B are continuously connected, a unit in which the structural units A and the structural units B are alternately connected or a structure in which the three units described above are mixed.

When a phenol resin having the structural unit described above is used as the phosphorus-containing curing agent, the epoxy resin composition is enhanced in a heat resistance.

Phosphorus-Containing Curing Agent 5:

The phosphorus-containing curing agent (A) can be a resin having a structural unit C represented by the following Chemical Formula (12) and a structural unit D represented by the following Chemical Formula (13):

[Ka 21]

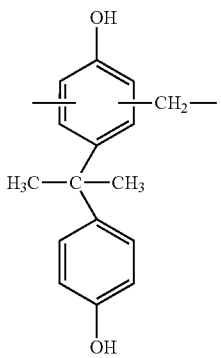

(12)

[Ka 22]

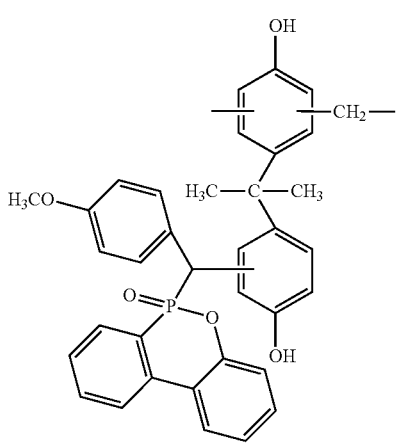

(13)

That is, the above resin may have a unit in which plural structural units C are continuously connected, a unit in which plural structural units D are continuously connected, a unit in which the structural units C and the structural units D are alternately connected or a structure in which the three units described above are mixed.

When a phenol resin having the structural unit described above is used as the phosphorus-containing curing agent, the epoxy resin composition is enhanced in a heat resistance.

Phosphorus-Containing Curing Agent 6:

The phosphorus-containing curing agent (A) can be a resin having a structural unit E represented by the following Chemical Formula (14) and a structural unit F represented by the following Chemical Formula (15):

[Ka 23]

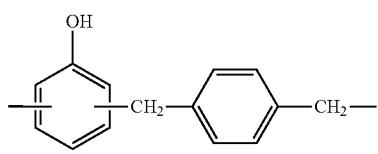

(14)

[Ka 24]

-continued (15)

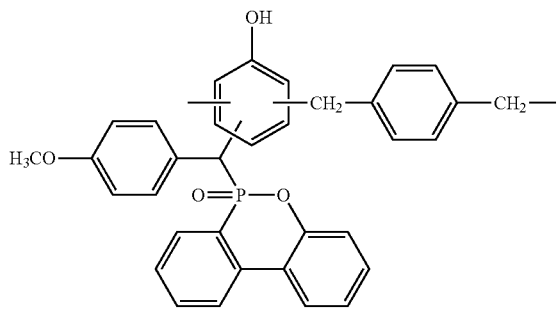

That is, the above resin may have a unit in which plural structural units E are continuously connected, a unit in which plural structural units F are continuously connected, a unit in which the structural units E and the structural units F are alternately connected or a structure in which the three units described above are mixed.

When a phenol resin having the structural unit described above is used as the phosphorus-containing curing agent, the epoxy resin composition is enhanced in a heat resistance.
Production Process for Phosphorus-Containing Curing Agent:

The phosphorus-containing curing agent represented by Chemical Formula (1) is obtained by reacting a phosphorus compound represented by the following Chemical Formula (16) with a compound having a phenolic hydroxyl group. Also, p-anisaldehyde may be added thereto in a certain case.

[Ka 25]

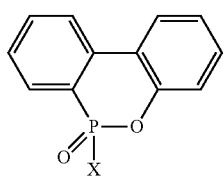

(16)

X in Chemical Formula (10) is a hydrogen atom or a halogen atom.

The compound having a phenolic hydroxyl group which can be used for producing the phosphorus-containing curing agent is preferably a compound having two or more phenolic hydroxyl groups in a molecule, and it includes resins (novolac resins) obtained by condensing or co-condensing phenols such as phenol, cresol, xylenol, resorcin, catechol, bisphenol A, bisphenol F and the like or naphthols such as α-naphthol, β-naphthol, dihydroxynaphthalene and the like with aldehydes such as formaldehyde, acetaldehyde, propionaldehyde, benzaldehyde, salicylaldehyde and the like under the presence of an acid catalyst, poly-para-vinylphenol resins and phenol.aralkyl resins having a xylylene group which are synthesized from phenols and dimethoxyparaxylylene. They may be used alone or in combination of two or more kinds thereof.

<<Curing Accelerating Agent>>

The kind and a blending amount of the curing accelerating agent shall not specifically be restricted, and imidazole base compounds, organic phosphorus base compounds, secondary amines, tertiary amines, quaternary ammonium salts and the like are used. They may be used in combination of two or more kinds thereof. A blending amount of the curing accelerating agent shall not specifically be restricted as well, and it is preferably 0.01 to 10.0 parts by mass based on 100 parts by mass of the resin which is the main ingredient.

<<Coupling Agent>>

A coupling agent may be added to the resin composition. Addition of the coupling agent makes it possible to enhance a dispersibility of the inorganic fillers and obtain the material which is excellent in a chemical resistance and a peeling strength.

The coupling agent shall not specifically be restricted as long as it is used usually for thermosetting resin compositions, and it includes, for example, silane compounds having primary and/or secondary and/or tertiary amino groups, various silane base compounds such as epoxysilanes, mercaptosilanes, alkylsilanes, ureidosilanes, vinylsilanes and the like, titanium base compounds, aluminum chelates, aluminum/zirconium base compounds and the like.

<Production Process for Prepreg>

A method for impregnating a base material with the resin composition shall not specifically be restricted. It is, for example, a wet method and a dry method and includes a method in which a base material is impregnated with the resin composition varnish, a method in which the resin composition is coated on a base material and the like. For example, a glass cloth and a glass nonwoven fabric are coated and impregnated with the thermosetting resin composition described above, and they are dried by heating continuously or discontinuously to be turned into a B stage, whereby a prepreg can be obtained.

Metal Clad Laminated Plate and Printed Wiring Board:

A metal foil is superposed on, if necessary, one face or both faces of the prepreg described above or a laminate obtained by laminating plural sheets of the prepreg, and it is molded by heating and pressurizing, whereby a metal foil clad laminated plate is prepared. A heating temperature thereof is preferably 170 to 240° C., and a pressure thereof is preferably 1 to 8 MPa.

Also, a metal layer of the above metal clad laminated plate can be subjected to wiring processing (circuit processing) to prepare a printed wiring board (circuit board).

A thickness of the above metal foil is usually 8 to 80 μm, and a thickness of the above laminate is usually 20 to 200 μm.

Further, a resin face is oppositely laminated via the prepreg described above on both faces or one face of the metal foil clad laminated plate or a board for an inner layer on which a circuit pattern is formed, and the laminated matter is heated and molded. Further, a circuit is formed on an outer layer thereof, whereby a multilayer printed wiring board can be obtained.

EXAMPLES

The present invention shall specifically be explained below with reference to examples, but the present invention shall not be restricted to these examples as long as they do not deviate from the technical idea of the present invention.

Production Example 1

Glass Filler A

An inorganic matter containing 53% by mass of $SiO_2$, 14% by mass of $Al_2O_3$, 20% by mass of CaO, 3% by mass of MgO and 10% by mass of $B_2O_3$ was molten at high temperature and cooled down, and then it was crushed by means of a ball mill and classified by means of a cyclone classifier to prepared a glass filler (crushed inorganic filler) A having an average particle diameter of 2.0 μm and a specific gravity of 2.5 g/cm$^3$.

The average particle diameter was measured by means of a laser dispersion particle size distribution meter MT3000 manufactured by Nikkiso Co., Ltd., wherein water was used as a dispersion liquid.

Production Example 2

Glass Filler B

An inorganic matter containing 62% by mass of $SiO_2$, 18% by mass of $Al_2O_3$, 8% by mass of CaO and 12% by mass of $B_2O_3$ was molten at high temperature and cooled down, and then it was crushed by means of a ball mill and classified by means of a cyclone classifier to prepared a glass filler (crushed inorganic filler) B having an average particle diameter of 2.0 μm and a specific gravity of 2.4 g/cm³.

Synthetic Example 1

Phosphorus Base Resin (Curing Agent) 1

A synthetic method for a phosphorus base resin (curing agent) 1 shall be described below.

The melt viscosity at 180° C. was measured according to ASTM D4287, and the softening point was measured according to JIS K7234.

A flask equipped with a thermometer, a cooling tube, a fractioning column, a nitrogen gas introducing tube and a stirrer was charged with 192.4 g (1.85 mole) of a phenol novolac resin, 68.0 g (0.50 mole) of p-anisaldehyded and 108.0 g (0.50 mole) of 9,10-dihydro-9-oxa-10-phosphaphenanthrene-10-oxide (hereinafter abbreviated as HCA), and the mixture was heated up to 180° C. to react them at 180° C. for 8 hours.

Then, water was removed while heating under a reduced pressure to obtain 355 g of a phenol resin (phosphorus base resin (curing agent)) 1 having a structural unit represented by the following Chemical Formula (10) and a structural unit represented by the following Chemical Formula (11). The phenol resin (phosphorus base resin (curing agent)) 1 thus obtained had a softening point of 125° C. (B & R method), a melt viscosity (measuring method: ICI viscometer method, measuring temperature: 180° C.) of 13 dPa·s, a hydroxyl equivalent of 190 g/eq and a phosphorus content of 4.2% by mass.

[Ka 26]

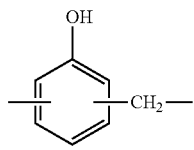

(10)

[Ka 27]

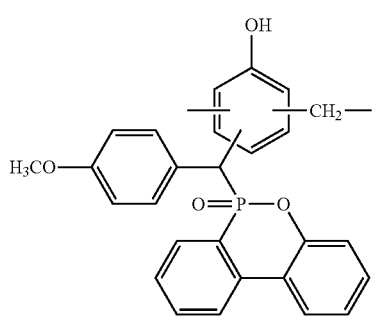

(11)

Synthetic Example 2

Phosphorus Base Resin (Curing Agent) 2

The same procedure as in Synthetic Example 1 was carried out to obtain 490 g of a phenol resin (phosphorus base resin (curing agent)) 2 having a structural unit represented by the following Chemical Formula (12) and a structural unit represented by the following Chemical Formula (13), except that in Synthetic Example 1, 330.4 g (2.80 mole) of a bisphenol A novolac resin was used in place of the phenol novolac resin. The above phenol resin (phosphorus base resin (curing agent)) 2 had a softening point of 139° C. (B & R method), a melt viscosity (measuring method: ICI viscometer method, measuring temperature: 180° C.) of 65 dPa·s, a hydroxyl equivalent of 232 g/eq and a phosphorus content of 3.1% by mass.

[Ka 28]

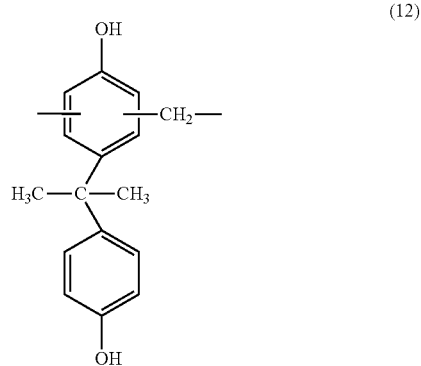

(12)

[Ka 29]

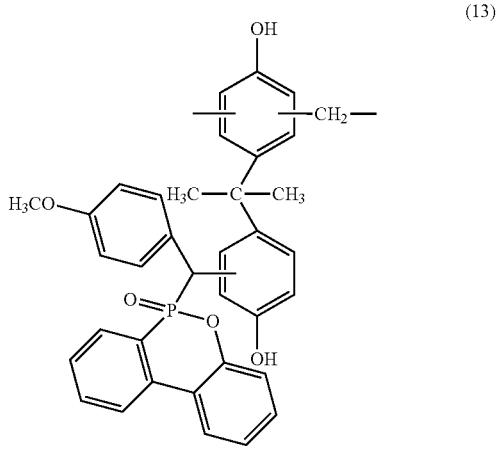

(13)

Synthetic Example 3

Phosphorus Base Resin (Curing Agent) 3

The same procedure as in Synthetic Example 1 was carried out to obtain 550 g of a phenol resin (phosphorus base resin (curing agent)) 3 having a structural unit represented by the following Chemical Formula (14) and a structural unit represented by the following Chemical Formula (15), except that in Synthetic Example 1, 392.9 g (2.35 mole) of a phenol aralkyl resin was used in place of the phenol novolac resin. The phenol resin (phosphorus base resin (curing agent)) 3 thus obtained had a softening point of 102° C. (B & R method), a melt viscosity (measuring method: ICI viscometer method, measuring temperature: 150° C.) of 2.5 dPa·s, a hydroxyl equivalent of 232 g/eq and a phosphorus content of 2.7% by mass.

[Ka 30]

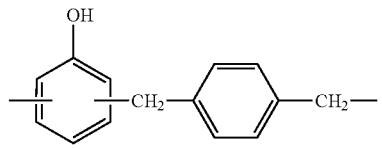

(14)

[Ka 31]

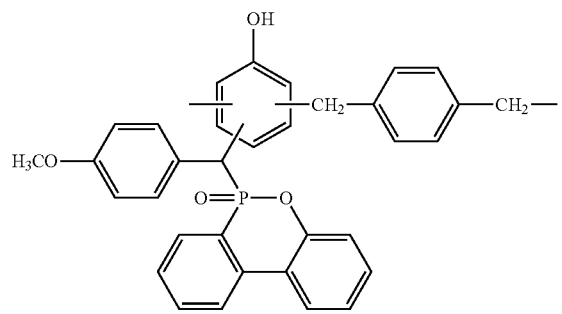

(15)

Example 1

A glass flask equipped with a stirring device, a condenser and a thermometer was charged with 25.0 parts by mass of a phenol novolac type epoxy resin (Epikote 154, manufactured by Mitsubishi Chemical Corporation, epoxy equivalent: 178) and 75.0 parts by mass of a brominated epoxy resin (Epikote 5046, manufactured by Mitsubishi Chemical Corporation, epoxy equivalent: 475) as epoxy resins, 31.3 parts by mass of a phenol novolac resin (HP-1100, manufactured by Hitachi Chemical Co., Ltd.) as a curing agent (phenol resin), 30.0 parts by mass of aluminum hydroxide (CL-303, average particle diameter: 4.1 μm, manufactured by Sumitomo Chemical Co., Ltd.) as a filler (1), 30.0 parts by mass of the glass filler A as a filler (2) and 0.1 part by mass of 2E4 MZ (manufactured by Shikoku Chemicals Corporation) as a curing accelerating agent to obtain a mixture. The mixture thus obtained was dissolved in MEK (methyl ethyl ketone) at a varnish temperature of 40° C. and diluted, and the solution was stirred at room temperature for 1 hour and controlled by MEK so that a resin composition varnish having a solid content of 60% by mass was obtained.

A glass cloth (style 2116, E glass) having a thickness of about 100 μm was impregnated with the above varnish and then dried at 150° C. for 5 minutes to obtain a prepreg having a resin content of 50% by mass. Sixteen sheets of the above prepreg were superposed, and copper foils of 12 μm were superposed on both sides thereof, followed by heating and pressurizing it at 170° C. for 90 minutes on a press condition of 4.0 MPa to prepare a copper clad laminated plate having a thickness of about 1.6 mm.

Example 2

A prepreg and a copper clad laminated plate were obtained in the same manner as in Example 1, except that used were 15.0 parts by mass of the phenol novolac type epoxy resin (Epikote 154, manufactured by Mitsubishi Chemical Corporation, epoxy equivalent: 178), 3.0 parts by mass of a tetrakishydroxyphenylmethane type epoxy resin (Epikote 1031S, manufactured by Mitsubishi Chemical Corporation, epoxy equivalent: 200) and 82.0 parts by mass of the brominated epoxy resin (Epikote 5046, manufactured by Mitsubishi Chemical Corporation, epoxy equivalent: 475) as the epoxy resins, 28.6 parts by mass of the phenol novolac resin (HP-1100, manufactured by Hitachi Chemical Co., Ltd.) as the curing agent (phenol resin), 43.0 parts by mass of aluminum hydroxide (CL-303, manufactured by Sumitomo Chemical Co., Ltd.) as the filler (1) and 43.0 parts by mass of the glass filler A as the filler (2).

Example 3

A prepreg and a copper clad laminated plate were obtained in the same manner as in Example 1, except that used were 100.0 parts by mass of the phenol novolac type epoxy resin (Epikote 154, manufactured by Mitsubishi Chemical Corporation, epoxy equivalent: 178) as the epoxy resin, 59.0 parts by mass of the phenol novolac resin (HP-1100, manufactured by Hitachi Chemical Co., Ltd.) as the curing agent (phenol resin), 79.0 parts by mass of aluminum hydroxide (CL-303, manufactured by Sumitomo Chemical Co., Ltd.) as the filler (1) and 79.0 parts by mass of the glass filler A as the filler (2).

Example 4

A prepreg and a copper clad laminated plate were obtained in the same manner as in Example 1, except that used were 80.0 parts by mass of the phenol novolac type epoxy resin (Epikote 154, manufactured by Mitsubishi Chemical Corporation, epoxy equivalent: 178) and 20.0 parts by mass of the tetrakishydroxyphenylmethane type epoxy resin (Epikote 1031S, manufactured by Mitsubishi Chemical Corporation, epoxy equivalent: 200) as the epoxy resins, 53.0 parts by mass of the phenol novolac resin (HP-1100, manufactured by Hitachi Chemical Co., Ltd.) as the curing agent (phenol resin), 33.5 parts by mass of a phosphorus phenol resin (XZ-92741, manufactured by The Dow Chemical Company) as a phosphorus base resin (curing agent), 60.0 parts by mass of aluminum hydroxide (CL-303, manufactured by Sumitomo Chemical Co., Ltd.) as the filler (1) and 60.0 parts by mass of the glass filler B as the filler (2).

Example 5

A prepreg and a copper clad laminated plate were obtained in the same manner as in Example 4, except that 40.0 parts by mass of the glass filler B was used as the filler (2).

Example 6

A prepreg and a copper clad laminated plate were obtained in the same manner as in Example 1, except that used were 80.0 parts by mass of the phenol novolac type epoxy resin (Epikote 154, manufactured by Mitsubishi Chemical Corporation, epoxy equivalent: 178) and 20.0 parts by mass of a bisphenol A novolac type epoxy resin (Epikote 157, manufactured by Mitsubishi Chemical Corporation, epoxy equivalent: 210) as the epoxy resins, 103.5 parts by mass of the resin synthesized in Synthetic Example 1 described above as a phosphorus base resin (curing agent), 45.0 parts by mass of aluminum hydroxide (CL-303, manufactured by Sumitomo Chemical Co., Ltd.) as the filler (1) and 45.0 parts by mass of the glass filler A as the filler (2) and that the curing agent (phenol resin) was omitted.

Example 7

A prepreg and a copper clad laminated plate were obtained in the same manner as in Example 1, except that used were 50.0 parts by mass of the phenol novolac type epoxy resin (Epikote 154, manufactured by Mitsubishi Chemical Corporation, epoxy equivalent: 178) and 50.0 parts by mass of the bisphenol A novolac type epoxy resin (Epikote 157, manufactured by Mitsubishi Chemical Corporation, epoxy equivalent: 210) as the epoxy resins, 119.0 parts by mass of the resin synthesized in Synthetic Example 2 described above as a phosphorus base resin (curing agent), 60.0 parts by mass of aluminum hydroxide (CL-303, manufactured by Sumitomo Chemical Co., Ltd.) as the filler (1) and 90.0 parts by mass of the glass filler A as the filler (2) and that the curing agent (phenol resin) was omitted.

Example 8

A prepreg and a copper clad laminated plate were obtained in the same manner as in Example 1, except that used were 30.0 parts by mass of the phenol novolac type epoxy resin (Epikote 154, manufactured by Mitsubishi Chemical Corporation, epoxy equivalent: 178) and 70.0 parts by mass of a bisphenol A novolac type epoxy resin (Epikote 157, manufactured by Mitsubishi Chemical Corporation, epoxy equivalent: 210) as the epoxy resins, 100.0 parts by mass of the resin synthesized in Synthetic Example 3 described above as a phosphorus base resin (curing agent), 120.0 parts by mass of aluminum hydroxide (CL-303, manufactured by Sumitomo Chemical Co., Ltd.) as the filler (1) and 80.0 parts by mass of the glass filler B as the filler (2) and that the curing agent (phenol resin) was omitted.

Comparative Example 1

A prepreg and a copper clad laminated plate were obtained in the same manner as in Example 1, except that 30.0 parts by mass of silica (SO-25R, manufactured by Admatechs Co., Ltd., amorphous silica powder, average particle diameter: 0.5 μm) was used as a filler (3) in place of the filler (2).

Comparative Example 2

A prepreg and a copper clad laminated plate were obtained in the same manner as in Example 2, except that 43.0 parts by mass of silica (SO-25R, manufactured by Admatechs Co., Ltd., amorphous silica powder, average particle diameter: 0.5 μm) was used as a filler (3) in place of the filler (1).

Comparative Example 3

A prepreg and a copper clad laminated plate were obtained in the same manner as in Example 2, except that the filler (1) and the filler (2) were not added.

The principal components used in Examples 1 to 8 and Comparative Examples 1 to 3 are summarized in Table 1 and Table 2.

TABLE 1

| Items | Example 1 | Example 2 | Example 3 | Example 4 | Example 5 | Example 6 | Example 7 | Example 8 |
|---|---|---|---|---|---|---|---|---|
| Epoxy resin | Epikote 154 25 parts | Epikote 154 15 parts | Epikote 154 100 parts | Epikote 154 80 parts | Epikote 154 80 parts | Epikote 154 80 parts | Epikote 154 50 parts | Epikote 154 30 parts |
| | Epikote 5046 75 parts | Epikote 5046 82 parts | — | — | — | — | — | — |
| | — | Epikote 1031S 3 parts | — | Epikote 1031S 20 parts | Epikote 1031S 20 parts | — | — | — |
| | — | Epikote 1031S 3 parts | — | Epikote 1031S 20 parts | Epikote 1031S 20 parts | Epikote 157 20 parts | Epikote 157 50 parts | Epikote 157 70 parts |
| Curing agent (phenol resin) | HP-1100 31.3 parts | HP-1100 28.6 parts | HP-1100 59.0 parts | HP-1100 53.0 parts | HP-1100 53.0 parts | — | — | — |
| Phosphorus base resin (curing agent) | — | — | — | XZ92741 33.5 | XZ92741 33.5 | Synthetic Example 1 103.5 | Synthetic Example 2 119.0 | Synthetic Example 3 100.0 |
| Filler (1) (aluminum hydroxide) | CL-303 30 parts | CL-303 43 parts | CL-303 79 parts | CL-303 60 parts | CL-303 60 parts | CL-303 45 parts | CL-303 60 parts | CL-303 120 parts |
| Filler (2) (inorganic matter comprising mainly SiO$_2$) | Glass filler A 30 parts | Glass filler A 43 parts | Glass filler A 79 parts | Glass filler B 60 parts | Glass filler B 40 parts | Glass filler A 45 parts | Glass filler A 90 parts | Glass filler A 80 parts |
| Filler (3) | — | — | — | — | — | — | — | — |
| Curing accelerating agent | 2E4MZ 0.1 part | 2E4MZ 0.1 part | 2E4MZ 0.1 part | 2E4MZ 0.1 part | 2E4MZ 0.1 part | 2E4MZ 0.1 part | 2E4MZ 0.1 part | 2E4MZ 0.1 part |
| Filler ratio (whole resin composition) | 31.3% | 40.1% | 49.8% | 39.1% | 34.9% | 30.7% | 40.6% | 50.0% |

TABLE 2

| Items | Comparative Example 1 | Comparative Example 2 | Comparative Example 3 |
|---|---|---|---|
| Epoxy resin | Epikote 154 25 parts | Epikote 154 15 parts | Epikote 154 15 parts |
| | Epikote 5046 75 parts | Epikote 5046 82 parts | Epikote 5046 82 parts |
| | — | Epikote 1031S 3 parts | Epikote 1031S 3 parts |

TABLE 2-continued

|  | Comparative Example | | |
|---|---|---|---|
| Items | 1 | 2 | 3 |
| Curing agent (phenol resin) | HP-1100 31.3 parts | HP-1100 28.6 parts | HP-1100 28.6 parts |
| Phosphorus base resin (curing agent) | — | — | — |
| Filler (1) (Aluminum hydroxide) | CL-303 30 parts | — | — |
| Filler (2) (inorganic matter comprising mainly SiO$_2$) | — | Glass filler A 43 parts | — |
| Filler (3) | SO25R 30 parts | S025R 43 parts | — |
| Curing accelerating agent | 2E4MZ 0.1 part | 2E4MZ 0.1 part | 2E4MZ 0.1 part |
| Filler ratio (whole resin composition) | 42.9% | 40.1% | 0.0% |

Evaluation:

The copper foils on the outer layers of the copper clad laminated plates prepared in Examples 1 to 8 and Comparative Examples 1 to 3 were removed on whole surfaces by etching to preparer samples, and the samples thus obtained were used to evaluate the following items. The results thereof are shown in Table 3.

(1) Appearance Evaluation:

The samples in which stripes formed by the flowing resin were not generated on a surface were rated as "good". Also, the samples in which the stripes were generated were rated as "stripes", and a generating spot thereof was specified.

(2) Thermal Expansion Coefficient:

The samples described above were used to measure thermal expansion coefficients in a range of 50 to 120° C. in a surface direction and a thickness direction according to a compression method by means of TMA2940 (manufactured by TA Instruments Inc.).

(3) Drilling Processability:

The samples described above were subjected to drilling processing of 20,000 holes in a drill diameter of 0.2 mm at a revolution number of 300 krpm and a feed speed of 2.1 m/minute with two sheets superposed using an aluminum plate of 150 μm for an entry board to measure a blade edge abrasion amount of the drill. A product number: MD E747S manufactured by Union Tool Co. was used for the drill.

In contrast with this, in Comparative Example 1 in which silica having a small average particle diameter (average particle diameter: 0.5 μm) was used in place of the filler (2), stripes formed by the flowing resin were generated at an end part on a surface of the base material due to an ununiformity of a fluidity between silica and aluminum hydroxide to deteriorate the base material appearance.

Further, in Comparative Example 2 in which silica having a small average particle diameter (average particle diameter: 0.5 μm) was used together with the filler (2), the drilling processability was inferior.

In Comparative Example 3 in which the fillers were not added, the thermal expansion coefficient was high.

The invention claimed is:

1. A prepreg prepared by impregnating a base material with a resin composition, wherein the resin composition contains (1) aluminum hydroxide having an average particle diameter of 2.5 to 4.5 μ; and (2) a glass filler having aan average particle diameter of 1.0 to 3.0 μ, (ii) a specific gravity of 2.3 to 2.6 g/cm$^3$, and (iii) a SiO$_2$ content of 50 to 65 % by mass based on the mass of the glass filler; and a total amount of the aluminum hydroxide and the glass filler in the resin composition is 30 to 50 % by mass based on a whole amount of solid matters in the resin composition.

2. The prepreg according to claim 1, wherein the resin composition contains a non-halogenated epoxy compound having at least two or more epoxy groups in a molecule.

3. The prepreg according to claim 1, wherein the resin composition contains a phosphorus-containing curing agent represented by the following Chemical Formula (1):

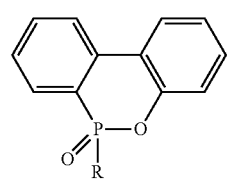

(1)

(wherein R is an organic group having two or more phenolic hydroxyl groups and a molecular weight of 180 or more).

4. The prepreg according to claim 3, wherein the organic group represented by R in Chemical Formula (1) comprises at

TABLE 3

|  | Example | | | | | | | | Comparative Example | | |
|---|---|---|---|---|---|---|---|---|---|---|---|
|  | 1 | 2 | 3 | 4 | 5 | 6 | 7 | 8 | 1 | 2 | 3 |
| Base material appearance | Good | Good | Good | Good | Good | Good | Good | Good | End part stripes | Good | Good |
| Thermal expansion coefficient ppm/° C. | 39 | 34 | 28 | 35 | 37 | 40 | 33 | 28 | 37 | 32 | 55 |
| Drilling processability | 20,000 holes OK | 20,000 holes OK | 20,000 holes OK | 20,000 holes OK | 20,000 holes OK | 20,000 holes OK | 20,000 holes OK | 20,000 holes OK | 20,000 holes OK | 8,000 holes Drill broken | 20,000 holes OK |

Results:

It has become clear that the copper clad laminated plates prepared in the examples are excellent in a base material appearance and have a small thermal expansion coefficient and an excellent drilling processability (life).

least one structure selected from structures represented by the following Chemical Formulas (2), (3), (4), (5) and (6) and has two or more phenolic hydroxyl groups:

(* in Formulas (2) to (6) shows a part bonded directly to a phosphorus atom in Chemical Formula (1)):

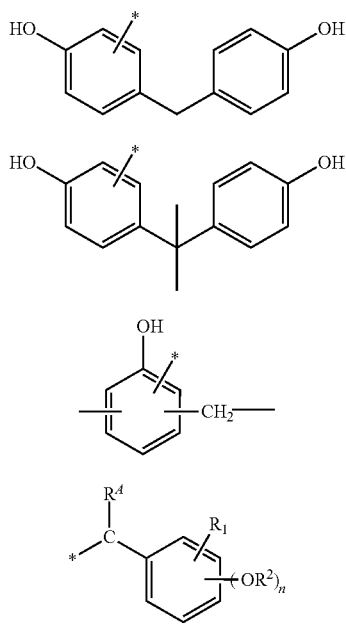

(R¹ in Chemical Formula (5) is a hydrogen atom or an alkyl group having 1 to 3 carbon atoms, and R² is an alkyl group having 1 to 4 carbon atoms; n is a number of a $OR^2$ group in the aromatic ring and is any of 1 to 3; and $R^A$ is an organic group having two or more phenolic hydroxyl groups);

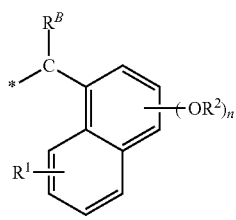

(R¹ in Formula (6) is a hydrogen atom or an alkyl group having 1 to 3 carbon atoms, and R² is an alkyl group having 1 to 4 carbon atoms; n is a number of a $OR^2$ group in the aromatic ring and is any of 1 to 3; and $R^B$ is an organic group having two or more phenolic hydroxyl groups).

5. The prepreg according to claim 4, wherein the organic group represented by R in Chemical Formula (1) comprises at least one structure selected from structures represented by the following Chemical Formulas (7), (8) and (9) and has two or more phenolic hydroxyl groups:

(* in Chemical Formulas (7) to (9) shows a part bonded directly to a phosphorus atom in Chemical Formula (1):

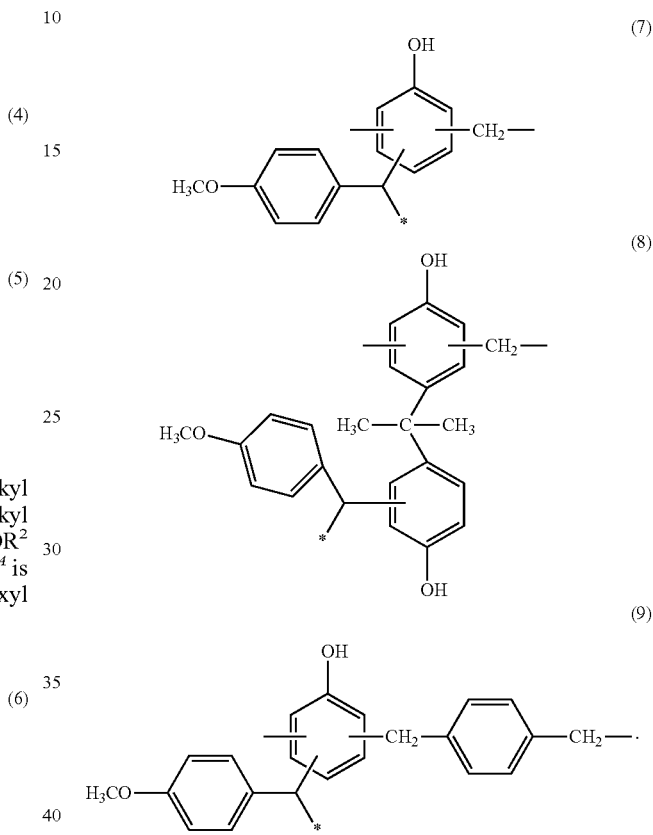

6. A metal clad laminated plate prepared by superposing one or plural plates of the prepreg according to claim 1, providing a metal foil on both faces or one face thereof and heating and pressurizing it.

7. A printed wiring board prepared by subjecting a metal layer of the metal clad laminated plate according to claim 6 to wiring processing.

* * * * *